US009648786B2

(12) United States Patent
Campbell et al.

(10) Patent No.: US 9,648,786 B2
(45) Date of Patent: May 9, 2017

(54) INTERLOCK ASSEMBLY FOR AIR-MOVING ASSEMBLY

(71) Applicant: INTERNATIONAL BUSINESS MACHINES CORPORATION, Armonk, NY (US)

(72) Inventors: Levi A. Campbell, Poughkeepsie, NY (US); Christopher R. Ciraulo, Wappingers Falls, NY (US); Milnes P. David, Fishkill, NY (US); Dustin W. Demetriou, Poughkeepsie, NY (US); John J. Loparco, Poughkeepsie, NY (US); Robert K. Mullady, Poughkeepsie, NY (US); Donald W. Porter, Highland, NY (US); Roger R. Schmidt, Poughkeepsie, NY (US); Richard P. Snider, New Paltz, NY (US); John G. Torok, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 376 days.

(21) Appl. No.: 14/499,422

(22) Filed: Sep. 29, 2014

(65) Prior Publication Data
US 2016/0095261 A1 Mar. 31, 2016

(51) Int. Cl.
*H05K 7/20* (2006.01)
*F24F 7/04* (2006.01)
(52) U.S. Cl.
CPC ........... *H05K 7/20736* (2013.01); *F24F 7/04* (2013.01); *H05K 7/20172* (2013.01); *H05K 7/20727* (2013.01)

(58) Field of Classification Search
CPC ........... H05K 7/20736; H05K 7/20727; H05K 7/20172; H05K 5/0208; H05K 5/0221; F24F 7/04; F04D 29/60; Y10T 403/59
(Continued)

(56) References Cited

U.S. PATENT DOCUMENTS 2,849,806 A 9/1958 Grahek
5,562,410 A 10/1996 Sach et al.
(Continued)

FOREIGN PATENT DOCUMENTS

CN 2907195 Y 5/2007
CN 203098342 U 7/2013
(Continued)

OTHER PUBLICATIONS

Cambpell, Levi A., "Interlock Assembly for Air-Moving Assembly", U.S. Appl. No. 14/831,105, filed Aug. 20, 2015 (33 pages).
(Continued)

*Primary Examiner* — William H Rodriguez
*Assistant Examiner* — Christopher Brunjes
(74) *Attorney, Agent, or Firm* — Steven Chiu, Esq.; Kevin P. Radigan, Esq.; Heslin Rothenberg Farley & Mesiti P.C.

(57) ABSTRACT

Apparatuses and methods are provided for preventing removal of an air-moving assembly from a chassis when in operating state. The apparatus includes an interlock assembly having a slide element and one or more interlock elements. The slide element is slideably coupled to the air-moving assembly and resides in a first position when the air-moving assembly is in the operating state, and is slidable to a second position when the air-moving assembly is in a quiesced state. The slide element prevents removal of the air-moving assembly from the chassis in the first position, and allows removal of the air-moving assembly from the
(Continued)

chassis in the second position. The interlock element(s) is associated with the slide element and prevents sliding of the slide element from the first position to the second position when the air-moving assembly is in the operating state.

19 Claims, 11 Drawing Sheets

(58) Field of Classification Search
USPC ....... 417/423.14, 423.15; 361/615–617, 726, 361/732; 292/137, 138, 150–153
See application file for complete search history.

(56) References Cited

U.S. PATENT DOCUMENTS

| | | | |
|---|---|---|---|
| 6,075,698 | A | 6/2000 | Hogan et al. |
| 6,115,250 | A | 9/2000 | Schmitt |
| 6,663,461 | B2 | 12/2003 | Fong |
| 6,710,240 | B1 | 3/2004 | Chen et al. |
| 6,711,013 | B2 | 3/2004 | Wobig et al. |
| 6,714,411 | B2 | 3/2004 | Thompson et al. |
| 6,817,889 | B2 | 11/2004 | Chang et al. |
| 6,947,281 | B2 | 9/2005 | Wrycraft et al. |
| 7,033,206 | B2 | 4/2006 | Chang et al. |
| 7,357,708 | B2 | 4/2008 | Lee |
| 7,800,902 | B2 | 9/2010 | Della Fiora et al. |
| 8,056,990 | B2 | 11/2011 | Ye |
| 8,320,121 | B2 | 11/2012 | Bisson et al. |
| 8,425,286 | B2 | 4/2013 | Coster et al. |
| 2002/0141879 | A1 | 10/2002 | Winkel et al. |
| 2005/0113015 | A1 | 5/2005 | Crippen et al. |
| 2008/0123280 | A1* | 5/2008 | Chen ................ G06F 1/187 361/679.33 |
| 2008/0280552 | A1 | 11/2008 | Baker et al. |
| 2012/0138262 | A1 | 6/2012 | Zhang et al. |
| 2013/0160984 | A1 | 6/2013 | Cash et al. |
| 2013/0323044 | A1 | 12/2013 | Sun |
| 2016/0081220 | A1* | 3/2016 | Chia ................. F24F 7/007 361/692 |

FOREIGN PATENT DOCUMENTS

| | | |
|---|---|---|
| GB | 1 377 387 | 12/1974 |
| JP | 10126079 A | 5/1998 |
| JP | 2002-164681 A | 6/2002 |
| JP | 2006-344661 A | 12/2006 |
| JP | 2008-17099 A | 7/2008 |

OTHER PUBLICATIONS

Campbell, Levi A., "Locking Louver Assembly for Air-Moving Assembly", U.S. Appl. No. 14/499,387, filed Sep. 29, 2014 (35 pages).

Campbell, Levi A., "Locking Louver Assembly for Air-Moving Assembly", U.S. Appl. No. 14/831,073, filed Aug. 20, 2015 (31 pages).

Campbell, Levi A., "Protective Louver Assembly for Air-Moving Assembly", U.S. Appl. No. 14/499,402, filed Sep. 29, 2014 (34 pages).

Cambpell, Levi A., "Protective Louver Assembly for Air-Moving Assembly", U.S. Appl. No. 14/831,090, filed Aug. 20, 2015 (30 pages).

Cambpell, Levi A., "List of IBM Patents and/or Patent Applications Treated as Related", U.S. Appl. No. 14/499,422, filed Sep. 29, 2014 (2 pages).

Campbell et al., Notice of Allowance for U.S. Appl. No. 14/831,105, filed Aug. 20, 2015 (U.S. Patent Publication No. 2016/0095263 A1) Dated Dec. 12, 2016 (9 Pages).

Campbell et al., "Interlock Assembly for Air-Moving Assembly", U.S. Appl. No. 14/499,422, filed Sep. 29, 2014 (36 pages).

Campbell et al., "Locking Louver Assembly for Air-Moving Assembly", U.S. Appl. No. 14/499,387, filed Sep. 29, 2014 (35 pages).

Campbell et al., "Protective Louver Assembly for Air-Moving Assembly", U.S. Appl. No. 14/499,402, filed Sep. 29, 2014 (34 pages).

Campbell et al., Office Action for U.S. Appl. No. 14/499,387 filed Sep. 29, 2014 (U.S. Patent Publication No. 2016/0095257 A1), dated Jan. 17, 2017 (15 pages).

Campbell et al., Office Action for U.S. Appl. No. 14/499,402, filed Sep. 29, 2014 (U.S. Patent Publication No. 2016/0095258 A1), dated Mar. 6, 2017 (23 pages).

* cited by examiner

INTERLOCK ASSEMBLY FOR AIR-MOVING ASSEMBLY

BACKGROUND

In many server applications, processors along with their associated electronics (e.g., memory, disk drives, power supplies, etc.) are packaged in removable drawer or subsystem configurations stacked within an electronics rack or frame comprising information technology (IT) equipment. In other cases, the electronics may be in fixed locations within the rack or frame. As circuit densities continue to increase at all levels of packaging, there is an ever-growing need for providing continuous cooling to the electronics rack, including the electronic subsystems thereof. As one solution, a cooling apparatus may be provided which includes one or more air-moving assemblies (e.g., axial fans or centrifugal fans) which facilitate moving an airflow through the electronics rack, usually front-to-back.

In certain implementations, multiple air-moving assemblies may be provided in association with a drawer or electronics subsystem in order that the assemblies may be concurrently maintainable, such that if one fails, the failure does not stop airflow through the electronics subsystem, and thus negatively affect operational availability of computing resources to the customer. In the event that an operating air-moving assembly is mistakenly removed, the fan or impeller wheel may be spinning at a high speed, for instance, at 4000 RPMs or above, and have significant momentum, due to the mass of the fan or impeller. This action could potentially result in injury to the operator removing the air-moving assembly.

BRIEF SUMMARY

The shortcomings of the prior art are overcome and additional advantages are provided through the provision, in one aspect, of an apparatus which includes an interlock assembly. The interlock assembly includes a slide element and at least one interlock element associated with the slide element. The slide element slideably couples to an air-moving assembly, which is removable from a chassis within which the air-moving assembly resides when in an operating state. The slide element resides in a first position when the air-moving assembly is in the operating state, and is slidable to a second position when the air-moving assembly is in a quiesced state, wherein the slide element facilitates preventing removal of the air-moving assembly from the chassis in the first position, and allows removal of the air-moving assembly from the chassis in the second position. The at least one interlock element associated with the slide element prevents sliding of the slide element from the first position to the second position when the air-moving assembly is in the operating state.

In another aspect, an apparatus is provided which includes an air-moving assembly and an interlock assembly. The air-moving assembly is removable from a chassis within which the air-moving assembly resides when in an operating state, and the interlock assembly includes a slide element and at least one interlock element associated with the slide element. The slide element is slideably coupled to the air-moving assembly, and resides in a first position when the air-moving assembly is in the operating state, and is slidable to a second position when the air-moving assembly is in a quiesced state, wherein the slide element facilitates preventing removal of the air-moving assembly from the chassis in the first position, and allows removal of the air-moving assembly from the chassis in the second position. The at least one interlock element associated with the slide element prevents sliding of the slide element from the first position to the second position when the air-moving assembly is in the operating state.

In a further aspect, a method is provided, which includes: associating an interlock assembly with an air-moving assembly, the air-moving assembly residing within a chassis when in an operating state and being removable from the chassis. The interlock assembly includes: a slide element slideably coupled to the air-moving assembly, the slide element residing in a first position when the air-moving assembly is in the operating state, and being slidable to a second position when the air-moving assembly is in a quiesced state, wherein the slide element facilitates preventing removal of the air-moving assembly from the chassis in the first position, and allows removal of the air-moving assembly from the chassis in the second position; and at least one interlock element associated with the slide element and preventing sliding of the slide element from the first position to the second position when the air-moving assembly is in the operating state.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

As used herein, the term "electronics rack" refers to any housing, frame, rack, compartment, blade server system, etc., having one or more heat-generating components of a computer system, electronic system, or information technology (IT) equipment, and may include, for example, a stand-alone computer processing system having high, mid, or low-end processing capability. In one embodiment, an electronics rack may include one or more electronic subsystems, for example, in one or more servers, sub-housings, blades, drawers, nodes, compartments, boards, etc., having one or more heat-generating electronic components disposed therein or thereon. An electronic system or subsystem may be removable or fixed, for example, relative to an electronics rack, with rack-mounted electronic drawers of an electronics rack and blades of a blade-center system being two examples of electronic systems or subsystems of an electronics rack to be cooled. As noted, in one embodiment, an electronic system/subsystem may include, or be, a server unit. Further, as used herein, the term "chassis" or "electronics chassis" refers to any housing, container, frame, rack, compartment, etc., and may be, in one embodiment, an electronics rack, or an electronic subsystem chassis which resides within the electronics rack.

Reference is made below to the drawings, where the same reference numbers used throughout different figures designate the same or similar components.

Figure 1:
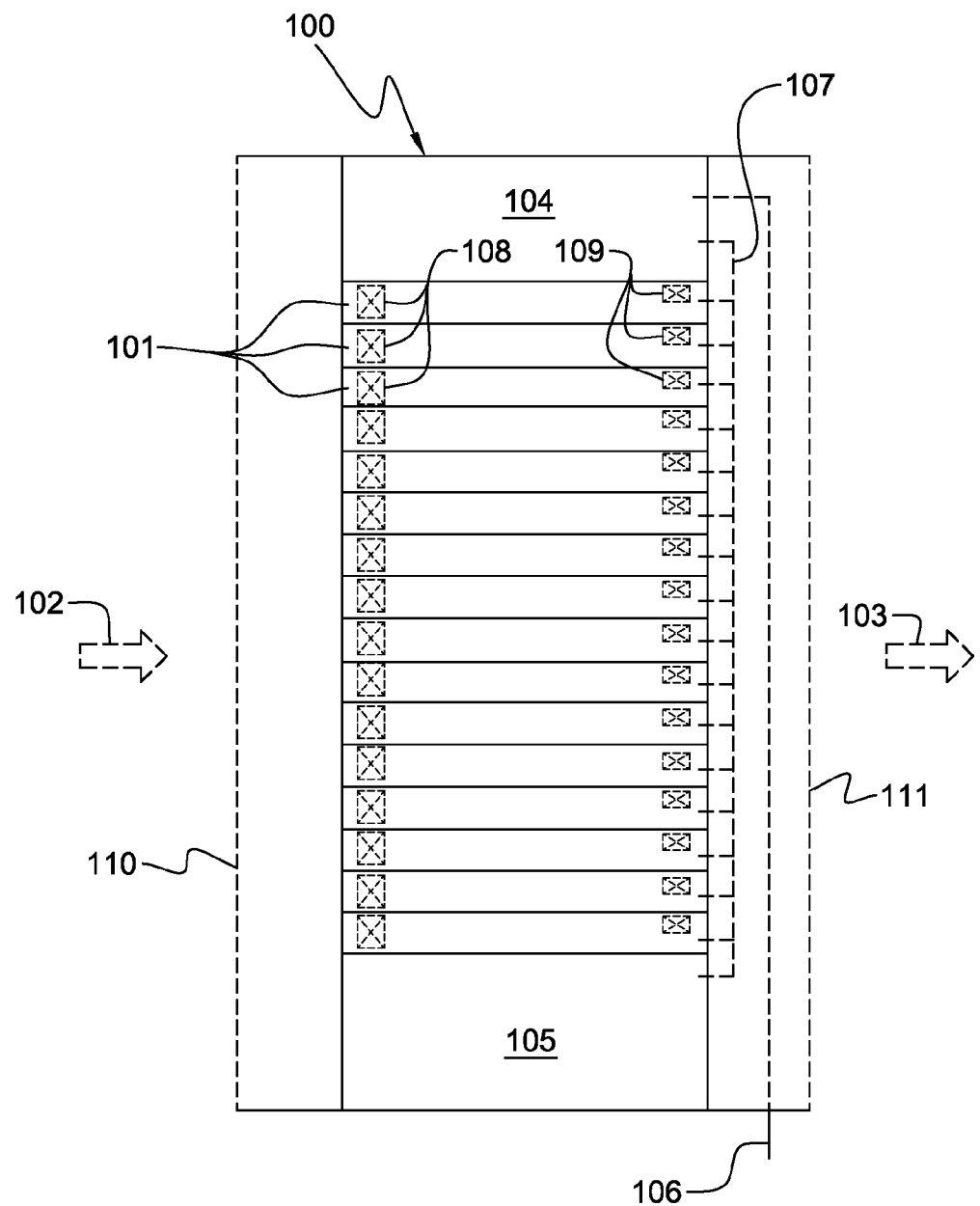
FIG. 1 is an elevational depiction of one embodiment of an electronics rack to incorporate therein one or more apparatuses, in accordance with one or more aspects of the present invention.

FIG. 1 depicts (by way of example) one embodiment of an electronics rack 100 with a plurality of electronic subsystems 101 to be cooled. In the embodiment illustrated, electronic subsystems 101 are air-cooled by cool airflow 102 ingressing via an air inlet 110, and exhausting out an air outlet 111 as hot airflow 103. One or more air-moving assemblies 108 are provided at the air inlet sides of electronic subsystems 101 and/or one or more air-moving assemblies 109 are provided at the air outlet sides of electronic subsystems 101 to facilitate airflow through the individual subsystems 101 as part of the cooling apparatus of electronics rack 100. By way of example, air-moving assemblies 108 at the air inlets to electronic subsystems 101 may be or include axial fan assemblies, and air-moving assemblies 109 disposed at the air outlets of electronic subsystems 101 may be or include centrifugal fan assemblies. One or more of electronic subsystems 101 may include heat-generating components to be cooled of a computer system, electronics system, or information technology (IT) equipment. For instance, one or more of the electronic subsystems 101 may include one or more processors and associated memory.

Electronics rack 100 may also include, by way of example only, one or more bulk power assemblies 104 of an AC to DC power supply assembly. AC to DC power supply assembly further includes, in one embodiment, a frame controller, which may be resident in the bulk power assembly 104 and/or in one or more electronic subsystems 101. Also illustrated in FIG. 1 is one or more input/output (I/O) drawer(s) 105, which may also include a switch network. I/O drawer(s) 105 may include, as one example, PCI slots and disk drivers for the electronics rack.

In implementation, a three-phase AC source feeds power via an AC power supply line cord 106 to bulk power assembly 104, which transforms the supplied AC power to an appropriate DC power level for output via distribution cable 107 to the plurality of electronic subsystems 101 and I/O drawer(s) 105. The number of electronic subsystems installed in the electronics rack is variable, and depends on customer requirements for a particular system. Further, although described with reference to multiple electronic subsystems 101, the air-moving assemblies discussed herein could reside within, for instance, bulk power assembly 104, or I/O drawer(s) 105. Again, the particular electronics rack configuration of FIG. 1 is presented by way of example only, and not by way of limitation.

Figure 2:
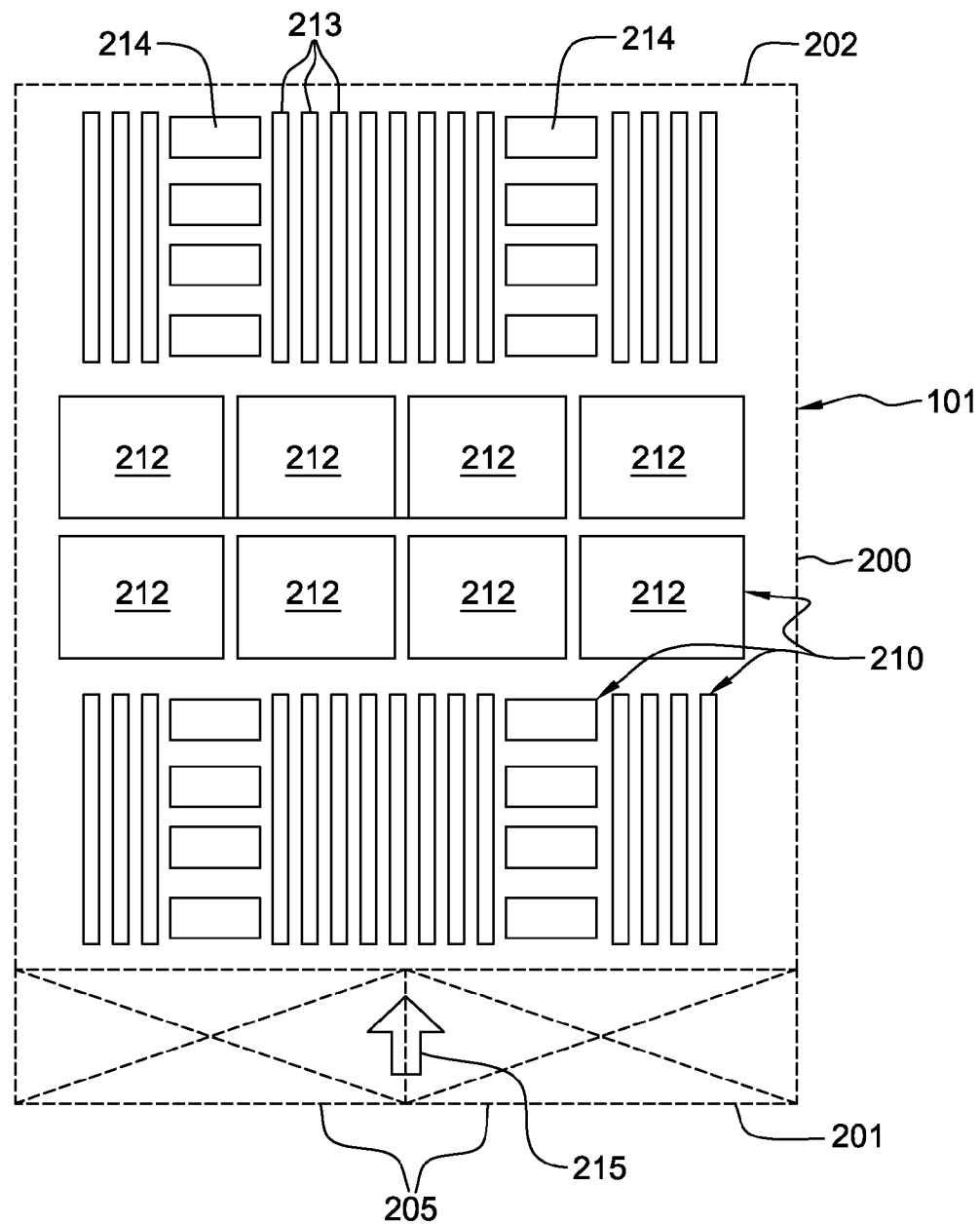
FIG. 2 is a plan view of one embodiment of an electronic subsystem layout illustrating multiple air-moving assemblies at an air inlet side of the electronic subsystem, which may incorporate one or more apparatuses, in accordance with one or more aspects of the present invention.

FIG. 2 depicts one embodiment of an electronic subsystem 101 layout being air-cooled utilizing one air-cooling approach, where one or more air-moving assemblies 205 provide forced airflow 215 in operational state to cool multiple electronic components 210 within electronic subsystem 101. Cool air is taken in through an air inlet 201 and heated air is exhausted out an air outlet 202 of the electronic subsystem. The multiple components 210 to be cooled may include, by way of example, multiple processor modules 212, as well as multiple arrays of memory modules 213 (e.g., dual-in-line memory modules (DIMMs)) and multiple rows of memory support modules 214 (e.g., DIMM control modules). In one implementation, air-cooled heat sinks (not shown) may be coupled to one or more of processor modules 212, memory modules 213, and/or memory support modules 214 to facilitate dissipation of heat therefrom.

In the depicted example of FIG. 2, the air-moving assemblies 205, as well as the electronic components, reside within a chassis 200 containing or supporting the electronic subsystem. Also, as depicted, the air-moving assemblies 205 disposed at the air inlet side 201 of the electronic subsystem may be redundant fan assemblies, which concurrently provide the cooling airflow 215 across or through the electronic components of the electronic subsystem.

Figure 3A:
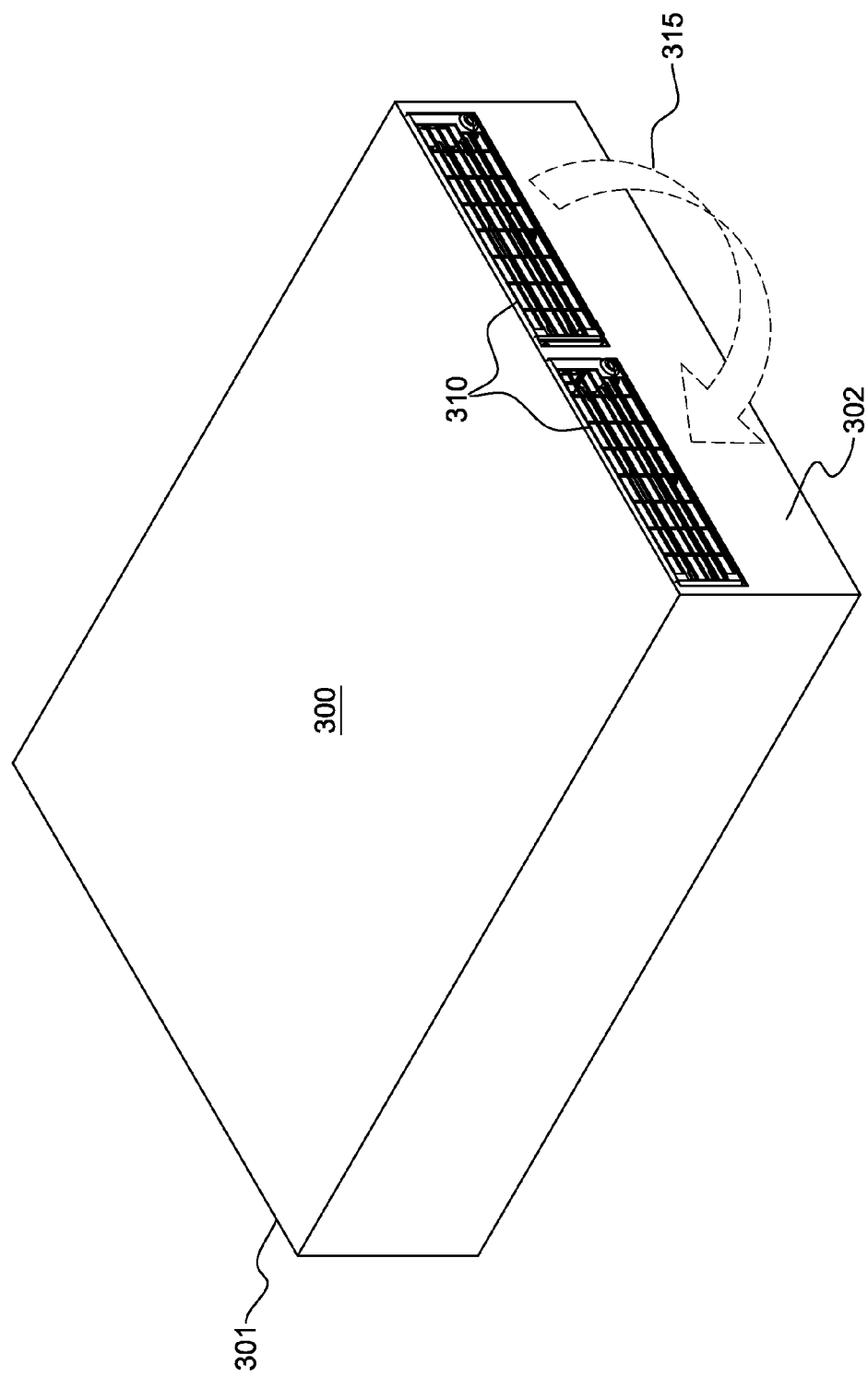
FIG. 3A depicts one embodiment of a chassis with multiple air-moving assemblies disposed at an air outlet side thereof, which may incorporate one or more apparatuses, in accordance with one or more aspects of the present invention.

FIG. 3A partially depicts an alternate embodiment of an electronic subsystem layout which includes a chassis 300, and redundant air-moving assemblies 310 disposed at an air outlet side 302 of the electronic subsystem, with the air inlet side 301 being, by way of example, at an opposite side of chassis 300. As illustrated in FIG. 3A, assuming that the left air-moving assembly 310 is in a quiesced, non-operating state, for instance, has been turned off or has failed, then a portion of air egressing from the operating, right air-moving assembly 310 can re-circulate 315 through the left air-moving assembly 310, and be drawn back into the right air-moving assembly 310, potentially significantly reducing the amount of airflow through chassis 300, and thus potentially the cooling of the electronic components of the electronic subsystem.

Figure 3B:
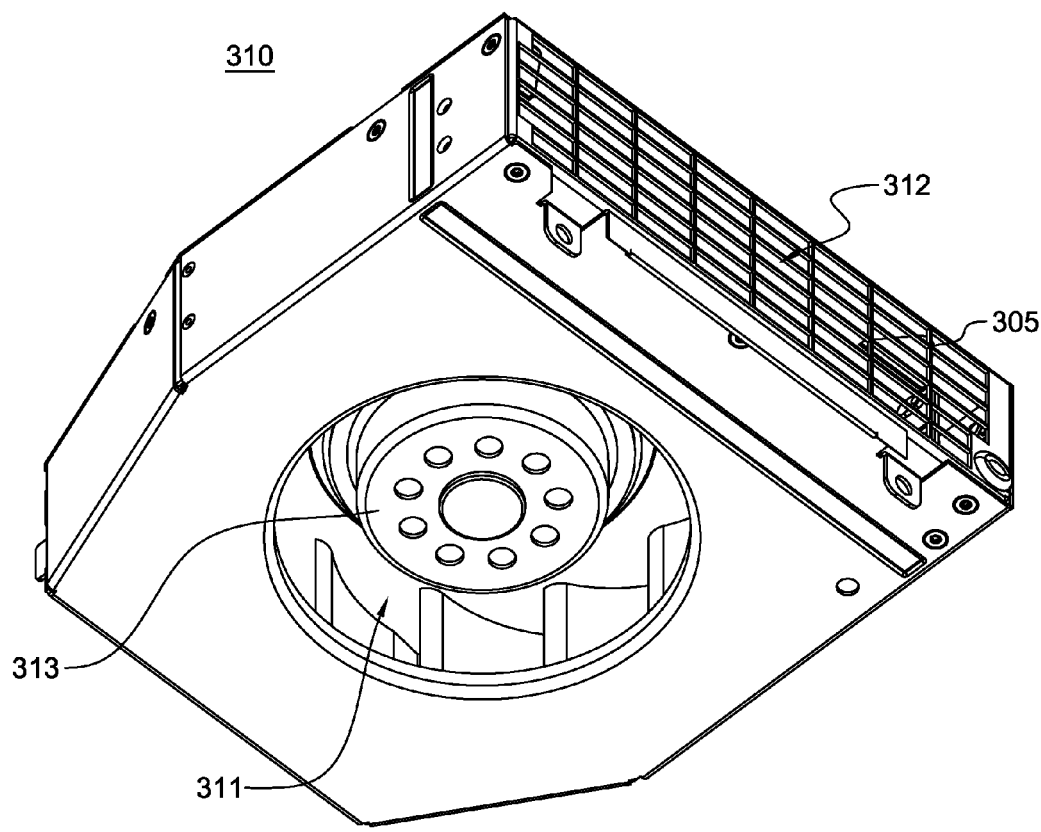
FIG. 3B depicts one embodiment of an air-moving assembly of FIG. 3A, shown removed from the chassis.

FIG. 3B depicts one embodiment of air-moving assembly 310 of FIG. 3A. In this embodiment, air-moving assembly 310 is depicted as a centrifugal fan assembly with a relatively large air inlet opening 311 in a lower surface thereof, exposing the centrifugal blower 313, and an air outlet 312, which may have a grating 305 as a safety feature. As noted above, in many systems today, air-moving assemblies may be designed to be concurrently maintainable, so that one assembly entering into a quiesced state does not significantly impact system cooling, and thus operational availability of computing resources to a customer. In the event that an operating air-moving assembly 310 is mistakenly removed, the fan or impeller wheel may be spinning at a high speed, and have significant momentum due to its mass. This mistake could result in injury to the operator removing the assembly, particularly in a centrifugal fan design such as illustrated in FIG. 3B, where there is a relatively large air inlet 311 within the assembly.

One possible solution to the issue is to provide a grill with openings smaller than an operator's fingers at the air assembly's inlet. However, this could significantly impede airflow through the assembly. An alternate approach is to disallow redundancy for concurrent replaceability, which is undesirable, since a customer could experience a computing outage due to a single air-moving assembly transitioning to quiesced state, for instance, due to a failure.

As a solution, disclosed herein are apparatuses and methods which address the above-noted drawbacks to existing concurrently-maintainable, air-moving assemblies. The apparatuses may include, for instance, an interlock assembly. The interlock assembly includes a slide element, and at least one interlock element associated with the slide element. The slide element slidably couples to the air-moving assembly, and the air-moving assembly is removable from a chassis within which the air-moving assembly resides when in an operating state, such as the above-described subsystem chassis of an electronics rack. The slide element resides in a first (operational) position when the air-moving assembly is in the operating state, and is slideable to a second (quiesced) position when the air-moving assembly is in a non-operating and quiesced state. In the first position, the slide element prevents or blocks removal of the air-moving assembly from the chassis, and in the second position, allows removal of the air-moving assembly from the chassis, for instance, by exposing one or more fasteners securing the air-moving assembly within the chassis. The at least one interlock element is associated with the slide element and operates as a safety interlock, preventing sliding of the slide element from the first position to the second position when the air-moving assembly is in the operating state.

In certain embodiments, the at least one interlock element physically contacts a feature associated with the air-moving assembly to prevent sliding of the slide element from the first position to the second position when the air-moving assembly is in the operating state. For instance, the feature with which the at least one interlock element interacts may itself be in a location indicative of the air-moving assembly being operational, or at least non-quiesced, with the interlock element(s) contacting the feature at that location.

In one embodiment, the at least one interlock element contacts a plugged cable of the air-moving assembly to prevent sliding of the slide element from the first position to the second position when the cable is plugged in, indicative of the air-moving assembly being in operating state. For instance, the at least one interlock element may be or include an interlock arm which projects from the slide element and contacts the plugged cable in a position that prevents sliding of the slide element from the first position to the second position when the cable is plugged in (and the air-moving assembly is in the operating state). This can be accomplished by limiting the size of the plugged cable to that necessary to plug in the air-moving assembly, with the interlock arm being positioned to contact the cable, such that the cable needs to be unplugged and moved before the interlock arm and associated slide element may be moved. This ensures that the air-moving assembly is in non-operating state before the slide element could be transitioned from the first (operational) position to the second (quiesced) position. Note that "plugged cable" can refer to a variety of cables associated with the air-moving assembly. For instance, the plugged cable could be a plugged power cable, plugged connector cable, a plugged flex circuit, a plugged control wire, a plugged intermittent interrupt wire, etc.

In certain embodiments, the interlock assembly further includes at least one louver disposed at one of an air inlet or an air outlet of the air-moving assembly, where the interlock assembly couples to the air-moving assembly. The at least one louver pivots between an operational orientation and a quiesced orientation, dependent on presence or absence, respectively, of airflow through the air-moving assembly. In one embodiment, the at least one interlock element of the interlock assembly contacts the at least one louver to prevent sliding of the slide element from the first position to the second position when the at least one louver is in the operational orientation, indicative of the air-moving assembly being in operating state. For instance, the interlock element may extend from the slide element, and be configured to engage and be stopped by at least one edge of the louver(s) when the louver is in the operational orientation. In this configuration, the interlock element may be or include a paddle-shaped or hook-shaped arm extending from the slide element, and be located to reside at a side edge of the louver(s), between the louver and air-moving assembly housing, when the slide element is in the first position. Upon transitioning of the louver(s) to the quiesced orientation, for instance, a vertical orientation, then the interlock element and slide element are free to move from the first to the second position.

In one implementation, the interlock assembly may include multiple louvers, with one louver of the multiple louvers being sized smaller than another louver of the multiple louvers, and with the interlock element extending from the slide element being configured to engage and be stopped by an edge of the one smaller louver when that louver is in operational orientation. For instance, the one louver may be sized smaller than another louver to remain in the operational orientation longer than the another louver during a transition of the multiple louvers from operational orientation to quiesced orientation due to a decreasing airflow through the air-moving assembly. In one example, the one louver may be half the size, or less, of the another louver of the multiple louvers. In this manner, the one louver may be configured to be the last louver of the multiple louvers to enter quiesced orientation with decreasing airflow through the air-moving assembly. By being configured and positioned to contact an edge of the one smaller louver, the interlock element prevents the slide element from being transitioned from the first position to the second position, until substantially all airflow through the air-moving assembly has ceased, and the one smaller louver has dropped from operating orientation to quiesced orientation.

In one or more embodiments, the interlock assembly may include multiple interlock elements, such as, for instance, one interlock element which interacts with the plugged cable of the air-moving assembly to prevent sliding of the slide element from the first position to the second position when the cable is plugged in, and another interlock element which interacts with one or more louvers disposed at an air inlet or an air outlet of the air-moving assembly, to prevent sliding of the slide element from the first position to the second position when the louver(s) is in the operational orientation. In this configuration, sliding of the slide element from the first position to the second position first requires unplugging of the cable, switching the air-moving assembly from the operating state to a non-operating state, and waiting a period of time for the airflow through the air-moving assembly to subside to a level sufficient for the louver(s) to drop via gravity from the operational orientation to the quiesced orientation.

In implementations where the interlock assembly includes one or more louvers, the louvers advantageously operate as anti-recirculation louvers when the air-moving assembly is in non-operating state. Further, in these implementations, the interlock assembly may be disposed at either the air inlet or air outlet of the air-moving assembly, for instance, dependent on the type of air-moving assembly, that is, whether the assembly includes an axial fan or centrifugal fan configuration, etc. In one embodiment, the air-moving assembly is a centrifugal fan, and the interlock assembly is disposed at the air outlet of the air-moving assembly.

Advantageously, in the embodiments described, the slide element blocks, at least in part, access in the first position to at least one fastener securing the air-moving assembly within the chassis. This blocking action prevents removal of the air-moving assembly from the chassis when the slide element is in the first position. Where one or more louvers are provided, the louvers operate as anti-recirculation louvers when the air-moving assembly is in non-operating state and the louvers are in quiesced orientation. Further, in certain implementations, the interlock element(s) of the interlock assembly prevents removal of the air-moving assembly from the chassis while in a non-quiesced state, that is, there is still sufficient airflow through the air-moving assembly to prevent the respective louver(s) from obtaining the quiesced orientation. This advantageously prevents removal of the air-moving assembly from the chassis until the rotor of the assembly is below a safe operational speed.

FIGS. 4A-5D described below depict, by way of example, a centrifugal fan assembly with a centrifugal fan rotor and housing, and a louver assembly comprising a plurality of louvers configured as elongated flaps with a pivot that hinges at one elongate edge, such that the weight of the louvers result in a substantially vertical, quiesced orientation of each louver in the absence of a force from air pressure induced by the centrifugal fan rotor being in non-operating state, and when airflow from the centrifugal fan exerts pressure on the louvers, the weight of the louvers is overcome and the louvers are in a substantially horizontal, operational orientation, indicative of an operating state of the air-moving assembly.

When transitioning from operating state to non-operating state of the air-moving assembly, the centrifugal fan slows from an operating speed (of, for instance, 4000 RPMs), to eventually a stopped or quiesced position. During this transition, after the power is removed from the centrifugal fan rotor, as the speed of the rotor decreases, eventually the weight of the recirculation louvers overcomes the pressure exerted by the airflow, and the louvers fall to the vertical, quiesced orientation, corresponding to the non-operating state of the air-moving assembly.

Figure 4A:
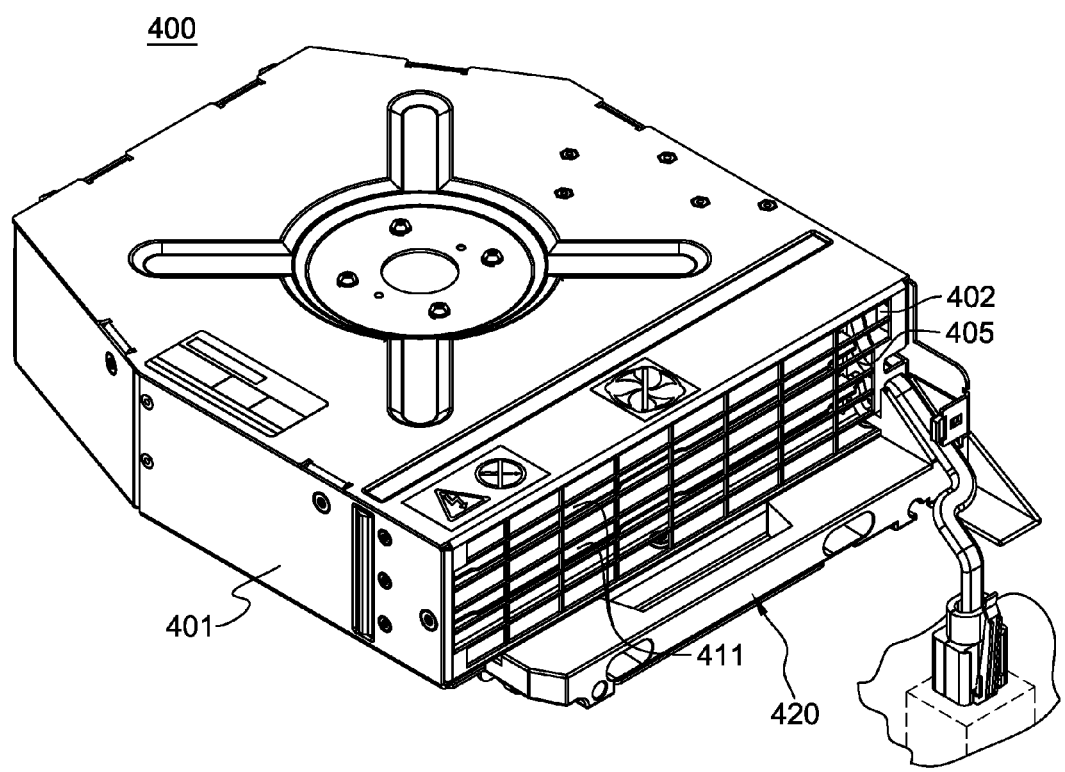
FIG. 4A depicts one embodiment of an apparatus comprising an air-moving assembly, shown in operating state, and an interlock assembly, in accordance with one or more aspects of the present invention.
Figure 4B:
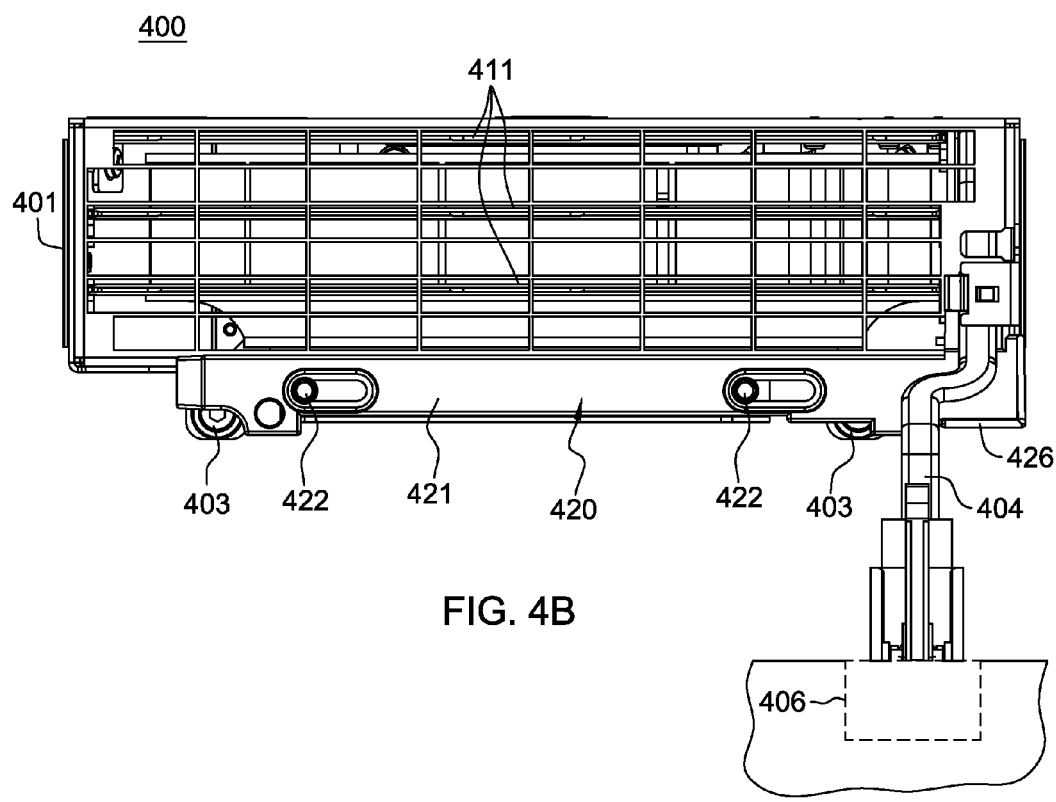
FIG. 4B is an elevational depiction of the apparatus of FIG. 4A, with the louver(s) shown in operational orientation and illustrating the slide element of the interlock assembly in a first position, blocking access to one or more fasteners securing the air-moving assembly within the subsystem chassis, in accordance with one or more aspects of the present invention.
Figure 4C:
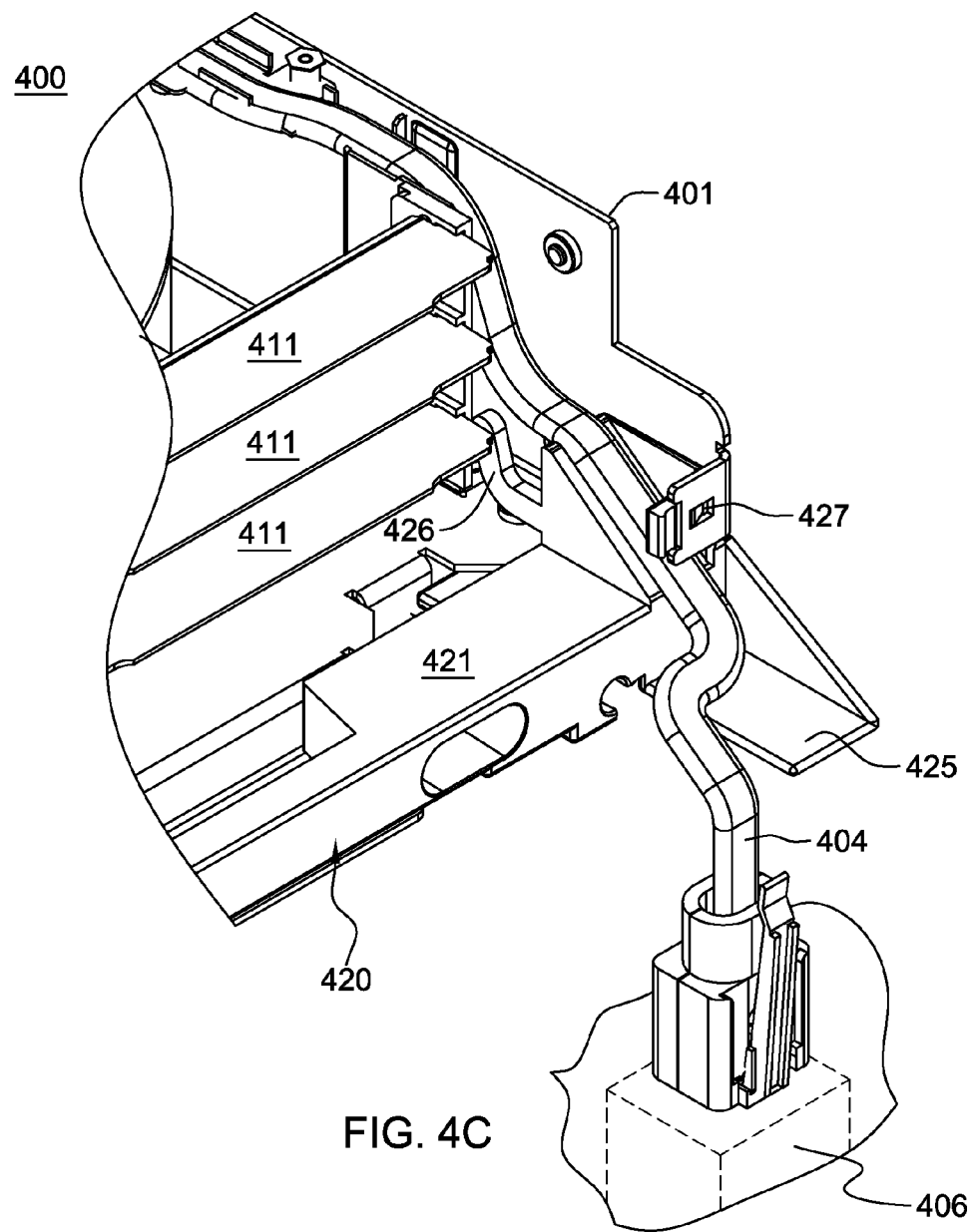
FIG. 4C is a partial enlarged view of the apparatus of FIGS. 4A & 4B, with the air-moving assembly in operating state, and illustrating engagement of interlock elements of the interlock assembly with a power cable of the air-moving assembly and one or more edges of one or more louvers associated with the air-moving assembly, in accordance with one or more aspects of the present invention.

FIGS. 4A-4C depict one embodiment of an apparatus 400, in accordance with one or more aspects of the present invention. Referring collectively to these figures, apparatus 400 includes an air-moving assembly 401, such as air-moving assembly 310 described above in connection with FIG. 3B, and a louver assembly, which includes in the depicted embodiment multiple louvers 411. In this embodiment, the air-moving assembly 401 is implemented as a centrifugal fan, which may be disposed, for instance, at the air outlet side of an electronic subsystem, such as within one of the electronic subsystems 101 described above in connection with FIG. 1. As noted, in this configuration, air is drawn in through an air inlet in a lower surface of the air-moving assembly and expelled through an air outlet 402, which may include a protective grid or grating 405.

Although depicted herein with multiple louvers 411, the louver assembly could include one or more louvers, as desired for a particular implementation. Louvers 411 are illustrated in FIGS. 4A-4C in an operational orientation (which in this implementation is substantially horizontal) that assumes air-moving assembly 401 is in an operating state. In particular, in the operational orientation depicted in FIGS. 4A-4C, the centrifugal fan rotor is assumed to be spinning at an operational speed sufficient to impel an airflow through louvers 411 at a speed which overcomes the weight of the louvers acting on the louver-hinge axis such that the louvers are maintained substantially horizontal, as depicted. Should the air-moving assembly be turned off, or fault, and thereby enter a non-operating or quiesced state where there is little or no airflow moving through the assembly 401, then the louvers 411 drop by gravity to a quiesced orientation, where the louvers are substantially vertical, advantageously preventing any recirculation of air back through the quiesced air-moving assembly. Note that in an alternate implementation, where the air-moving assembly is disposed at the air inlet side of an electronic subsystem, the hinged louvers may pivot inwardly when transitioning from, for instance, a quiesced orientation to an operational orientation.

As shown in FIGS. 4A-4C, apparatus 400 includes an interlock assembly 420 coupled, in the embodiment depicted, to air-moving assembly 401 at an air outlet side 402 thereof. Interlock assembly 420 includes a slide element 421 constrained by two or more guide pins 422 to be movable between a first position, shown in FIGS. 4A-4C, and a second position, shown in FIG. 5D. In the first position depicted, slide element 421 fully or partially blocks access to one or more fasteners 403 securing air-moving assembly 401 within a chassis, such as a subsystem chassis within an electronics rack, as described above. As discussed herein, the slide element is in the first position when the air-moving assembly is operating.

As illustrated in FIG. 4C, the interlock assembly 420 further includes one or more interlock elements 425, 426, 427, which project from or are coupled to slide element 421. By way of example only, the multiple interlock elements 425, 426, 427 are presented in the example of FIGS. 4A-4C. Each slide element in this configuration represents an interlocking extension from slide element 421 in the form of a specially-configured arm or tab. For instance, interlock element 425 is configured as an interlock arm (or shelf) which contacts a plugged cable 404 (such as a power cable) of air-moving assembly 401 when the cable is plugged in to a respective receiving socket 406 associated with, for instance, the electronic system or subsystem. In the embodiment depicted, it is assumed that the receiving socket is disposed below the air-moving assembly 401, and the plugged cable 404 depends downwards when plugged in for operation of the air-moving assembly. Additionally, and as noted, a second interlock element 426 is provided in this example, which may be configured as a paddle-shaped arm or hook-shaped arm, to physically contact an edge of one or more louvers 411 when the louvers are in operational orientation, as depicted in FIGS. 4A-4C. In the operating state of the depicted apparatus, interlock arm 426 is shown to reside between the louvers and the air-moving assembly housing. Further, as noted, a third interlock element 427 is provided in this example, configured as a bendable tab which engages a slot in the air-moving assembly housing when the slide element 421 is in the first position. When the first and second interlock elements 425, 426 are ready to move, an operator may depress tab 427 to disengage the tab from the housing slot, and allow movement of the slide element 421. Third interlock element 427 also facilitates holding slide element 421 in a fixed position, further preventing second interlock element 426 from interfering with louver 411 operation. For instance, third interlock element 427 may be configured to prevent any movement of second interlock element 426 due to vibration, etc.

Note that, in this example, each interlock element 425, 426, 427 prevents movement of slide element 421 when the air-moving assembly is in operating state. These elements are provided by way of example only, and depending on the implementation, the interlock features can vary. Further, note that a single interlock element could be employed, associated with or extending from the slide element, to contact one or more features of the air-moving assembly, or one or more features associated with the air-moving assembly, when the air-moving assembly is in operating state.

Advantageously, interlock assembly 420 of the apparatus of FIGS. 4A-4C prevents the removal of the air-moving assembly from its associated chassis until a number of prerequisite steps have occurred, resulting in delaying removal of the air-moving assembly until sufficient time has elapsed such that the fan rotor is spinning slowly enough to prevent injury to the operator, that is, should the operator attempt removal of the air-moving assembly before it is fully stopped. In the embodiment of FIGS. 4A-4C, the power cable is plugged in, and the fasteners securing the air-moving assembly to its associated chassis are covered by the slide element. In this orientation, the air-moving assembly is fully installed in the system, and can be energized to provide cooling airflow. When in operating state, the interlock element(s) of the interlock assembly prevents movement of the slide element from its first position to its second position, where the fasteners securing the air-moving assembly within the chassis would be accessible. In the embodiment depicted, multiple interlock elements are presented by way of example, with one physically contacting the plugged cable of the air-moving assembly, and the other physically contacting one or more edges of one or more louvers of a louver assembly provided, for instance, as either part of the air-moving assembly, or as part of the interlock assembly, as desired.

Figure 5A:
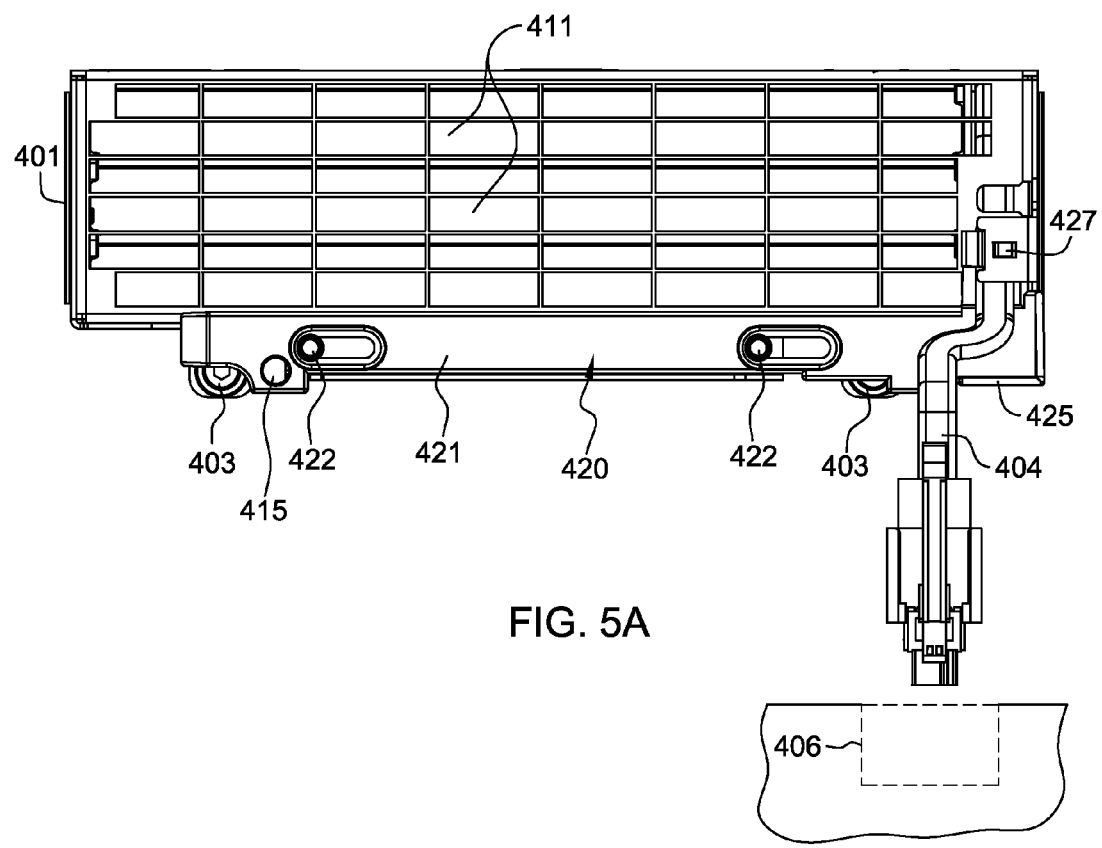
FIG. 5A is an elevational depiction of the apparatus of FIGS. 4A-4C, with the air-moving assembly in a non-operating and quiesced state, where the power cable has been unplugged, and the louvers are shown in quiesced orientation, in accordance with one or more aspects of the present invention.
Figure 5B:
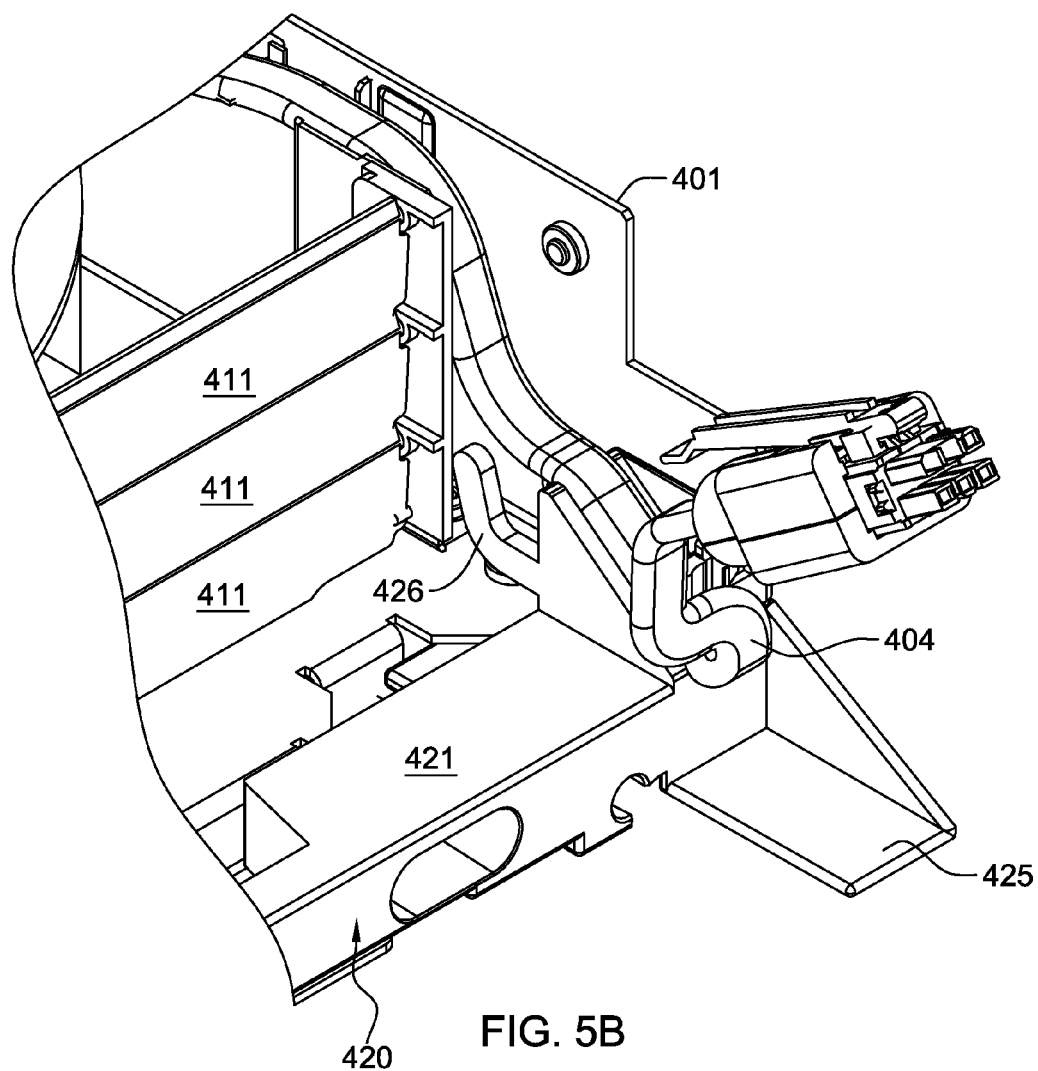
FIG. 5B is a partial enlarged view of the apparatus of FIG. 5A, showing the power cable lifted to free one interlock element to move and allow sliding of the slide element from its first position to its second position, and the other interlock element shown free to move in front of the louvers in quiesced orientation, in accordance with one or more aspects of the present invention.
Figure 5C:
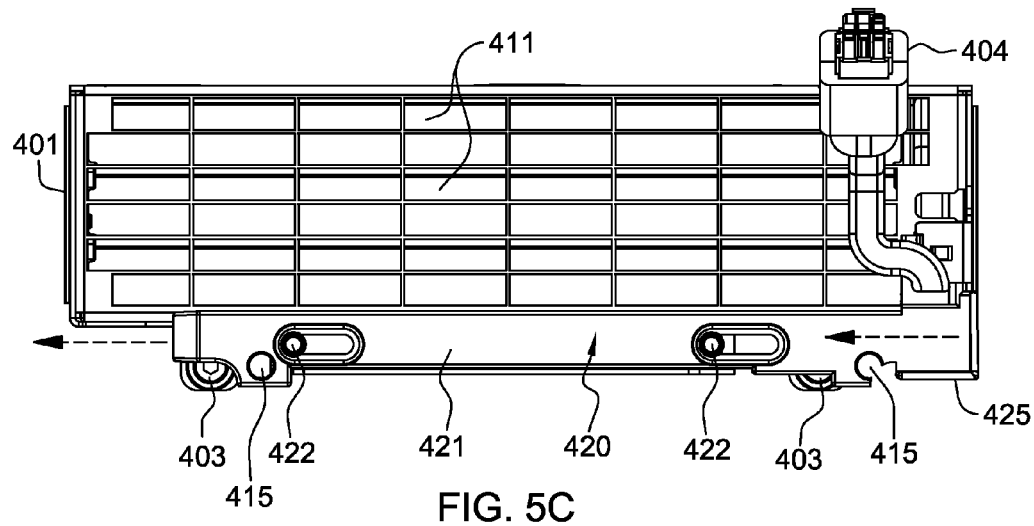
FIG. 5C is an elevational view of the apparatus of FIGS. 5A & 5B, with the slide element shown being moved from its first position to its second position to allow access to one or more fasteners securing the air-moving assembly within the chassis, in accordance with one or more aspects of the present invention.
Figure 5D:
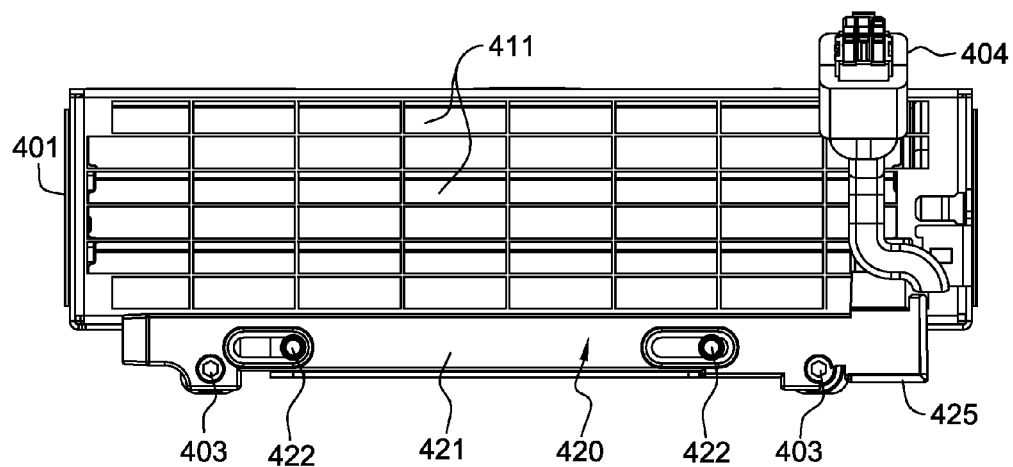
FIG. 5D is an elevational view of the apparatus of FIGS. 5A-5C, with the slide element depicted in its second position, which as shown, allows access to one or more fasteners securing the air-moving assembly within the chassis, in accordance with one or more aspects of the present invention.

FIGS. 5A-5D depict air-moving assembly 401 in a non-operating state, with cable 404 unplugged from the respective receiving socket 406, and the one or more louvers 411 shown in vertical, quiesced orientation. In FIGS. 5A & 5B, slide element 421 of interlock assembly 420 is shown in its first position, with interlock element 426 to the right of louvers 411, and interlock element 427 still latched, and as shown in FIG. 5A, interlock arm 425 still engaging power cable 404 of air-moving assembly 401. As noted, in the first position of slide assembly 421 on guide pins 422, the slide assembly fully or partially blocks access to one or more fasteners 403 securing air-moving assembly 401 within the respective system chassis (not shown).

As shown in FIGS. 5A & 5B, sliding of slide element 421 from the first position to the second position first requires unplugging of cable 404, to switch the air-moving assembly from the operating state to an non-operating state, and moving the cable 404 (in this embodiment) away from physical contact with interlock element 425 extending from slide element 421 of the interlock assembly 420. After waiting a period of time sufficient for the airflow through the air-moving assembly to subside to a level at which louvers 411 transition from operational orientation to the quiesced orientation depicted in FIGS. 5A-5D, and after unlatching interlock element 427, the slide element 421 may be moved on guide pins 422 from the first position depicted in FIGS. 5A-5C, to the second position depicted in FIG. 5D, where one or more fasteners 403 are exposed through the respective openings in slide element 421, allowing an operator access to the fasteners to remove the fasteners, and thus remove the air-moving assembly from the respective chassis. Note that in the non-operating state of air-moving assembly 401, and with louvers 411 in quiesced orientation, the slide element 421 is free to move from the first position to the second position once the power cable 404 is lifted from engagement with interlock element 425, and the latched interlock tab 427 is released. In the configuration depicted, interlock element 426 is free to move in front of louvers 411 in quiesced orientation. That is, interlock element 426, which in an operational state resides between the louvers and the air-moving assembly housing, is free to move with the louvers in a quiesced state, allowing transition of the slide element.

Those skilled in the art should note that the above-described configuration of interlock assembly, slide element, and one or more interlock elements, is presented by way of example only, and that other configurations are possible without departing from the scope of the invention as defined by the claims presented herewith. For instance, a single interlock element could extend from slide element 421 to interact with a feature of the air-moving assembly when the assembly is in operating state. Specifically, interlock element 425, interlock element 426, or interlock element 427 could be employed by itself, depending on the implementation. Other interlock element configurations and positions are possible, dependent, for instance, on the particular air-moving assembly configuration with which the interlock assembly is to be employed. Further, the interlock assembly disclosed herein could be integrated with the air-moving assembly at the time of manufacture, or be provided as an add-on to an existing air-moving assembly already installed in the field.

Figure 6:
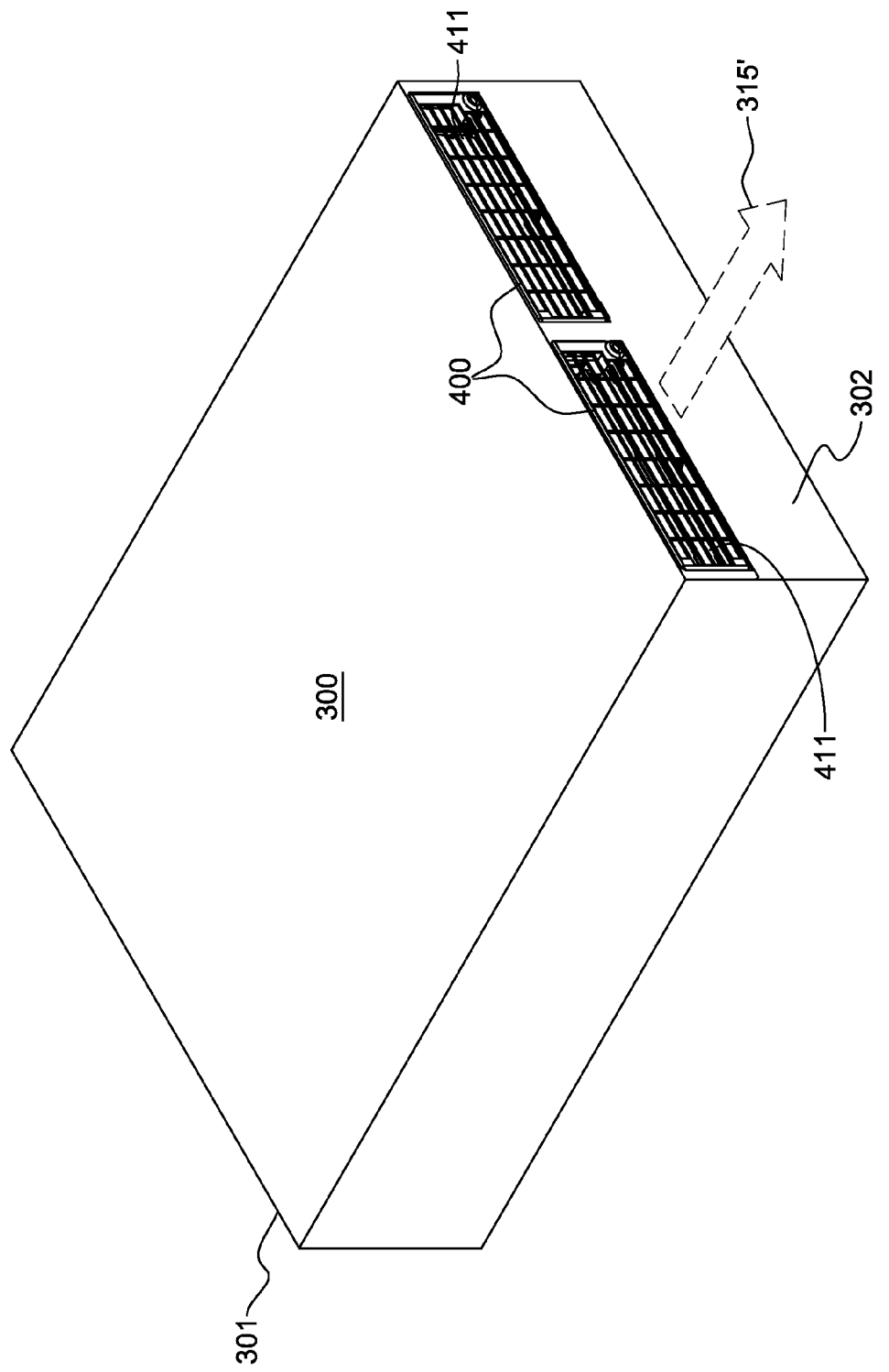
FIG. 6 depicts one embodiment of two air-moving and interlock assemblies disposed side-by-side within a chassis, with one air-moving assembly shown in operational state, and the other air-moving assembly shown in quiesced state, in accordance with one or more aspects of the present invention.

FIG. 6 depicts the electronic subsystem chassis 300 of FIG. 3, with the apparatus 400 of FIGS. 4A-5D. In this depiction, the left-most air-moving assembly is assumed to be operational, with airflow 315' egressing across the respective louvers 411 in operational orientation, and the right-most air-moving assembly is assumed to be in quiesced state, with the louvers 411 of that apparatus shown in quiesced orientation, substantially vertical, thereby blocking any recirculation of egressing airflow 315' back into chassis 300, through the quiesced air-moving assembly. Thus, the protective louver assembly, in addition to providing the above-described facility for preventing removal of the air-moving assembly when airflow is passing through the assembly, also prevents recirculation of egressing airflow from one assembly back into the chassis through a quiesced assembly.

Note that as a further advantage, an interlock assembly such as described herein, and in particular, the slide element thereof, may be configured with tolerances which prevent the slide element from transitioning from the second position, with the air-moving assembly in non-operating state, to the first position. For instance, one or more fasteners securing the air-moving assembly within its respective chassis may be located such that if not fully seated, the unseated fastener prevents movement of the slide element. In one implementation, the fasteners are countersunk such that the slide element may be moved, allowing, for instance, for plugging of the air-moving assembly cable.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
   an interlock assembly, the interlock assembly comprising:
   a slide element which slideably couples to an air-moving assembly, the air-moving assembly being removable from a chassis within which the air-moving assembly resides when in an operating state, the slide element residing in a first position when the air-moving assembly is in the operating state, and being slidable to a second position when the air-moving assembly is in a quiesced state, wherein the slide element facilitates preventing removal of the air-moving assembly from the chassis in the first position, and allows removal of the air-moving assembly from the chassis in the second position; and
   at least one interlock element associated with the slide element and preventing sliding of the slide element from the first position to the second position only when the air-moving assembly is in the operating state.

2. The apparatus of claim 1, wherein the at least one interlock element physically contacts a feature associated with the air-moving assembly to prevent sliding of the slide element from the first position to the second position when the air-moving assembly is in the operating state.

3. The apparatus of claim 1, wherein the at least one interlock element engages a plugged cable of the air-moving assembly to prevent sliding of the slide element from the first position to the second position when the air-moving assembly is in the operating state.

4. The apparatus of claim 3, wherein the at least one interlock element comprises an interlock arm which extends from the side element and engages the plugged cable to prevent sliding of the slide element from the first position to the second position when the air-moving assembly is in the operating state.

5. The apparatus of claim 4, wherein transitioning the slide element from the first position to the second position requires unplugging of the plugged cable, to transition the air-moving assembly from the operating state to a non-operating state, and to disengage the interlock aim from contact with the power cable.

6. The apparatus of claim 1, wherein the interlock assembly further comprises at least one louver disposed at one of an air inlet or an air outlet of the air-moving assembly, the at least one louver pivoting between an operational orientation and a quiesced orientation, dependent on presence or absence, respectively, of airflow through the air-moving assembly, and wherein the at least one interlock element contacts a louver of the at least one louver to prevent sliding of the slide element from the first position to the second position when the at least one louver is in the operational orientation.

7. The apparatus of claim 6, wherein the at least one interlock element extends from the slide element and engages at least one side edge of the louver when the at least one louver is in operational orientation, thereby preventing sliding of the slide element from the first position to the second position.

8. The apparatus of claim 7, wherein the at least one interlock element comprises an interlock arm extending from the slide element.

9. The apparatus of claim 6, wherein the interlock assembly further comprises multiple interlock elements, the at least one interlock element being at least one interlock element of the multiple interlock elements, and wherein the multiple interlock elements further comprise at least one other interlock element which engages a plugged cable of the air-moving assembly to farther prevent sliding of the slide element from the first position to the second position when the air-moving assembly is in the operating state.

10. The apparatus of claim 1, wherein the slide element blocks, at least in part, access in the first position to at least one fastener securing the air-moving assembly within the chassis.

11. The apparatus of claim 1, wherein the air-moving assembly comprises a centrifugal fan, and the interlock assembly is coupled to the air-moving assembly an air outlet thereof.

12. An apparatus comprising:
   an air-moving assembly residing within a chassis when in an operating state, the air-moving assembly being removable from the chassis; and
   an interlock assembly, the interlock assembly comprising:
      a slide element slideably coupled to the air-moving assembly, the slide element residing in a first position when the air-moving assembly in the operating state, and being slidable to a second position when the air-moving assembly is in a quiesced state, wherein the slide element facilitates preventing removal of the air-moving assembly from the chassis in the first position, and allows removal of the air-moving assembly from the chassis in the second position; and
      an interlock element associated with the slide element and preventing sliding of the slide element from the first position to the second position only when the air-moving assembly is in the operating state.

13. The apparatus of claim 12, wherein the at least one interlock element physically contacts a feature associated with the air-moving assembly to prevent sliding of the slide element from the first position to the second position when the air-moving assembly is in the operating state.

14. The apparatus of claim 12, wherein the at least one interlock element engages a plugged cable of the air-moving assembly to prevent sliding of the slide element from the first position to the second position when the air-moving assembly is in the operating state.

15. The apparatus of claim 14, wherein the at least one interlock element comprises an interlock arm which extends from the slide element and engages the plugged cable to prevent sliding of the slide element from the first position to the second position when the air-moving assembly is in the operating state.

16. The apparatus of claim 12, wherein the interlock assembly further comprises at least one louver disposed at one of an air inlet or an air outlet of the air-moving assembly, the at least one louver pivoting between an operational orientation and a quiesced orientation, dependent on presence or absence, respectively, of airflow through the air-moving assembly, and wherein the at least one interlock element contacts a louver of the at least one louver to prevent sliding of the slide element from the first position to the second position when the at least one louver is in the operational orientation.

17. The apparatus of claim 16, wherein the at least one interlock element extends from the slide element and engages at least one side edge of the louver when the at least one louver is in operational orientation, thereby preventing sliding of the slide element from the first position to the second position.

18. The apparatus of claim 16, wherein the interlock assembly further comprises multiple interlock elements, the at least one interlock element being at least one interlock element of the multiple interlock elements, and wherein the multiple interlock elements further comprise at least one other interlock element which engages a plugged cable of the air-moving assembly to further prevent sliding of the slide element from the first position to the second position when the air-moving assembly is in the operating state.

19. The apparatus of claim 12, wherein the slide element blocks, at least in part, access in the first position to at least one fastener securing the air-moving assembly within the chassis.

* * * * *